US009887344B2

(12) United States Patent
Itayama et al.

(10) Patent No.: US 9,887,344 B2
(45) Date of Patent: *Feb. 6, 2018

(54) PIEZOELECTRIC ELEMENT, PIEZOELECTRIC ACTUATOR DEVICE, LIQUID EJECTING HEAD, LIQUID EJECTING APPARATUS, AND ULTRASONIC MEASURING APPARATUS

(71) Applicant: Seiko Epson Corporation, Tokyo (JP)

(72) Inventors: Yasuhiro Itayama, Chino (JP); Takayuki Yonemura, Suwa (JP)

(73) Assignee: Seiko Epson Corporation (JP)

(*) Notice: Subject to any disclaimer, the term of this patent is extended or adjusted under 35 U.S.C. 154(b) by 245 days.

This patent is subject to a terminal disclaimer.

(21) Appl. No.: 14/755,511

(22) Filed: Jun. 30, 2015

(65) Prior Publication Data
US 2016/0005950 A1    Jan. 7, 2016

(30) Foreign Application Priority Data

Jul. 1, 2014    (JP) .................. 2014-136247

(51) Int. Cl.
H01L 41/187    (2006.01)
C04B 35/468    (2006.01)
H01L 41/08    (2006.01)
(Continued)

(52) U.S. Cl.
CPC ...... H01L 41/0815 (2013.01); B41J 2/14233 (2013.01); H01L 41/0973 (2013.01); H01L 41/1876 (2013.01); B41J 2002/14491 (2013.01); B41J 2202/03 (2013.01); H01L 41/1132 (2013.01); H01L 41/318 (2013.01)

(58) Field of Classification Search
CPC ............. H01L 41/1871; H01L 41/1878; C04B 35/4682; C04B 2235/3298;
(Continued)

(56) References Cited

U.S. PATENT DOCUMENTS

2004/0090500 A1* 5/2004 Murai .................. B41J 2/14233
347/70
2005/0072996 A1    4/2005 Kijima et al.
(Continued)

FOREIGN PATENT DOCUMENTS

JP        07-045883 A    2/1995
JP    2001-223404 A    8/2001
(Continued)

OTHER PUBLICATIONS

Chang et al., "Dielectric mapping of Pb(Ni1/3Nb2/3)O3—PbZrO3—PbTiO3 ternary phase spread", Sep. 9, 2002, Applied Physics Letters, vol. 81, No. 11, 4 pages (title page and pp. 2062-2064).*

(Continued)

Primary Examiner — Matthew E Hoban
Assistant Examiner — Lynne Edmondson
(74) Attorney, Agent, or Firm — Harness, Dickey & Pierce, P.L.C.

(57) ABSTRACT

Provided is a piezoelectric element in which a first electrode, a piezoelectric layer, and a second electrode are sequentially stacked on a substrate, the piezoelectric layer being formed of composite oxide having a perovskite structure which contains at least Pb, Nb, and Ti, in which the piezoelectric layer has a tetragonal crystal structure, the crystal is oriented to {100} against the substrate, and regions are mixed in a crystal lattice, each region including a (100) plane and a (001) plane which are orthogonal to a stacking direction, and the composite oxide of the piezoelectric layer is represented by the following general expression.

$x\text{Pb}(\text{Ni}_{1/3},\text{Nb}_{2/3})\text{O}_3\text{-}y\text{PbZrO}_3\text{-}z\text{PbTiO}_3$ ($10 \leq x \leq 40$, $0 < y \leq 40$, $50 \leq z \leq 90$)

11 Claims, 11 Drawing Sheets

(51) Int. Cl.
*B41J 2/14* (2006.01)
*H01L 41/09* (2006.01)
*H01L 41/113* (2006.01)
*H01L 41/318* (2013.01)

(58) Field of Classification Search
CPC .... C04B 2235/3262; C04B 2235/3236; C04B 2235/3244; C04B 2235/5445; C04B 2235/77; C04B 2235/79; C04B 2235/3248; C04B 2235/786; C04B 2235/785; C04B 2235/768
USPC ............... 252/62.9 PZ, 92.9 R; 501/134, 137
See application file for complete search history.

(56) References Cited

U.S. PATENT DOCUMENTS

| | | | | |
|---|---|---|---|---|
| 2005/0218756 | A1* | 10/2005 | Fujii | B41J 2/161 310/358 |
| 2006/0256167 | A1* | 11/2006 | Ifuku | B41J 2/14233 347/72 |
| 2010/0244632 | A1* | 9/2010 | Maekawa | G01C 19/5607 310/360 |
| 2013/0093288 | A1* | 4/2013 | Fox | C30B 23/02 310/348 |
| 2015/0214465 | A1 | 7/2015 | Mawatari | |

FOREIGN PATENT DOCUMENTS

| | | |
|---|---|---|
| JP | 2004-214274 A | 7/2004 |
| JP | 2006-282411 A | 10/2006 |
| JP | 5472549 B1 | 4/2014 |

OTHER PUBLICATIONS

Extended European Search Report for Patent Application No. EP15174781.3, dated Jan. 5, 2016 (7 pages).

* cited by examiner

NO STRESS

TENSILE STRESS

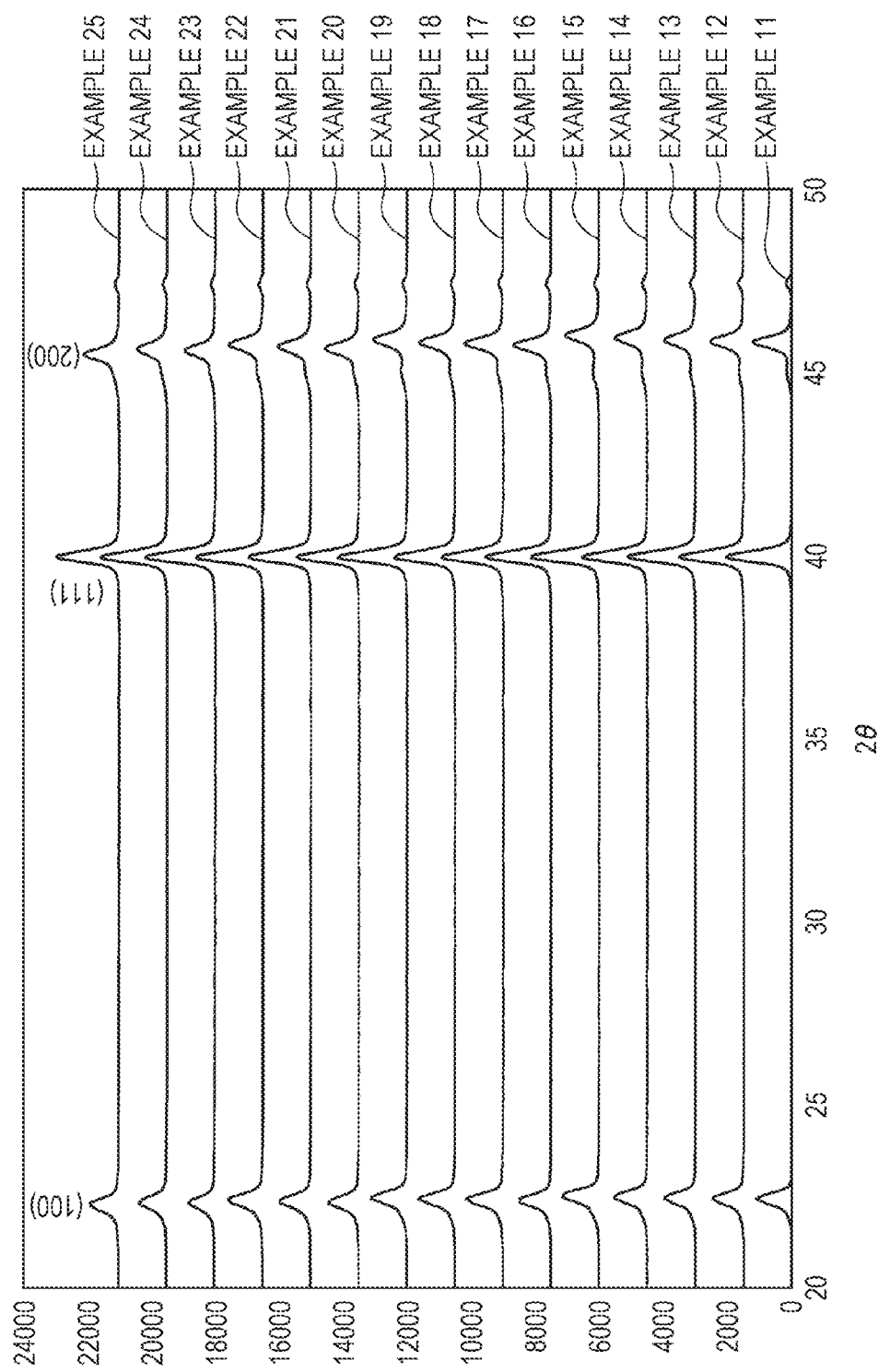

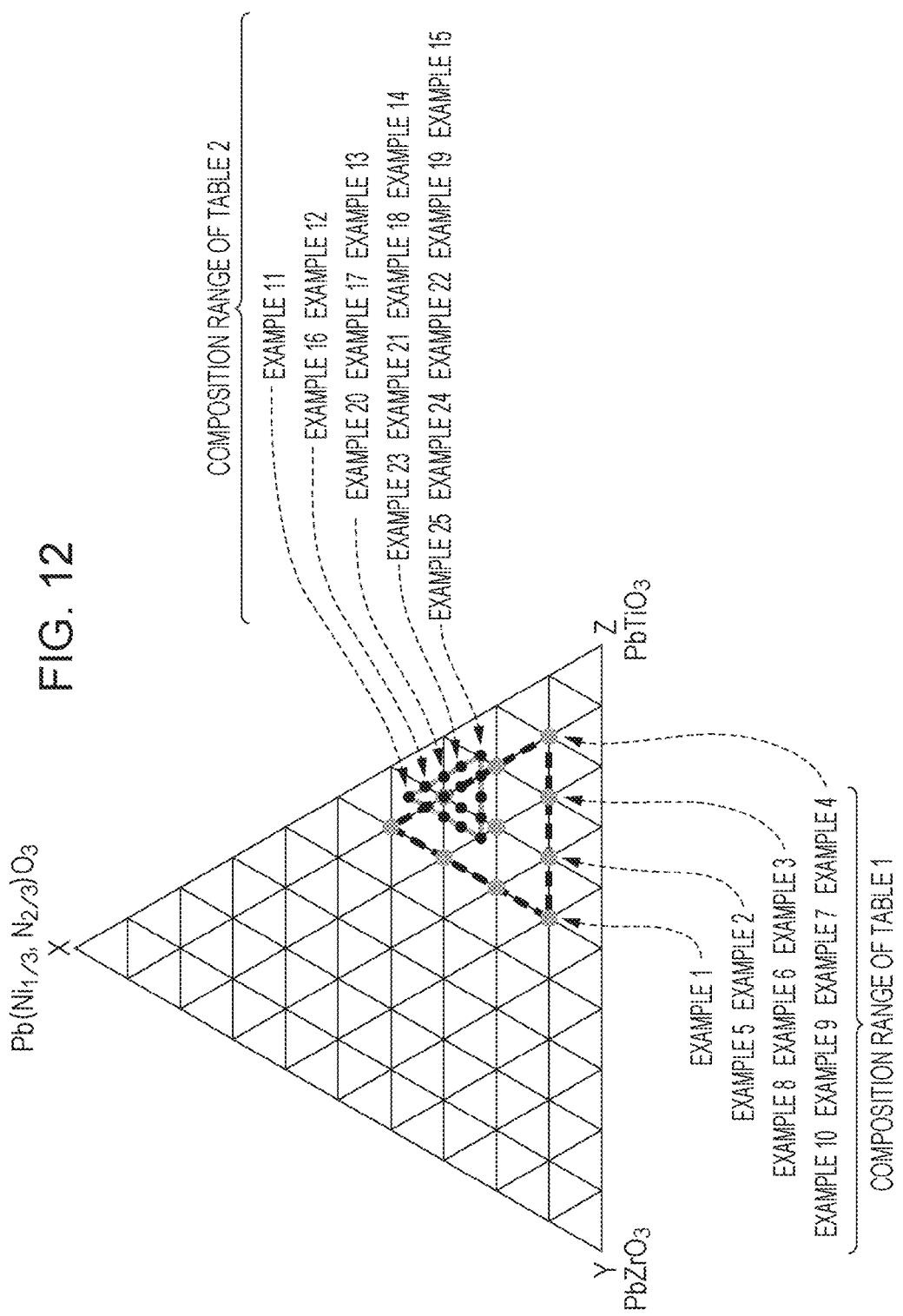

PIEZOELECTRIC ELEMENT, PIEZOELECTRIC ACTUATOR DEVICE, LIQUID EJECTING HEAD, LIQUID EJECTING APPARATUS, AND ULTRASONIC MEASURING APPARATUS

BACKGROUND

1. Technical Field

The present invention relates to a piezoelectric element, a piezoelectric actuator device, a liquid ejecting head, a liquid ejecting apparatus, and an ultrasonic measuring apparatus.

2. Related Art

In the related art, a piezoelectric element is generally formed by interposing a piezoelectric layer formed of a piezoelectric material between two electrodes. This piezoelectric element is widely used as an ultrasonic transmitting element or an ultrasonic receiving element in an ultrasonic measuring apparatus, a flexural vibration mode actuator device in a liquid ejecting head, and the like. As a representative example of a piezoelectric material used for this type of the piezoelectric layer, lead zirconate titanate (PZT) is included (see JP-A-2001-223404). PZT basically has a structure of a rhombohedral crystal and shows piezoelectric characteristics (distortion quantity) by inducing electric dipole moment which occurs by applying an electric field.

As the piezoelectric material, a material used for so-called 90° domain rotation which is different from the above-described principle has been known. This piezoelectric material shows the piezoelectric characteristics (distortion quantity) for example, in such a manner that an electric field is applied to a tetragonal crystal in which an a-axial component, a b-axial component, and c-axial component are mixed, and thus the a-axial component and the b-axial component are rotated by 90° for the c-axial component.

However, recently, a liquid ejecting head having higher density and higher performance has been required. Improvement of a piezoelectric constant of a piezoelectric layer in which displacement occurs by using 90° domain rotation is also desired.

SUMMARY

An advantage of some aspects of the invention is to provide a piezoelectric element, a piezoelectric actuator device, a liquid ejecting head, a liquid ejecting apparatus, and an ultrasonic measuring apparatus which can have an improved piezoelectric constant of a piezoelectric layer in which displacement occurs by using 90° domain rotation.

According to an aspect of the invention, there is provided a piezoelectric element in which a first electrode, a piezoelectric layer, and a second electrode are sequentially stacked on a substrate, the piezoelectric layer being formed of composite oxide having a perovskite structure which contains at least Pb, Nb, and Ti, in which the piezoelectric layer has a tetragonal crystal structure, the crystal is oriented to {100} against the substrate, and regions are mixed in a crystal lattice, each region including a (100) surface and a (001) surface which are orthogonal to a stacking direction, and the composite oxide of the piezoelectric layer is represented by the following general expression.

$$x\text{Pb}(\text{Ni}_{1/3},\text{Nb}_{2/3})\text{O}_3\text{-}y\text{PbZrO}_3\text{-}z\text{PbTiO}_3$$

$(10 \leq x \leq 40, 0 < y \leq 40, 50 \leq z \leq 90)$

In this case, the piezoelectric element which can have an improved piezoelectric constant of a piezoelectric layer in which displacement occurs by using 90° domain rotation and has excellent piezoelectric characteristics is obtained.

It is preferable that relationships of $22 \leq x \leq 38$, $0 < y \leq 22$, and $56 \leq z \leq 72$ are satisfied in the general expression. In this case, the piezoelectric element which can have an improved piezoelectric constant of a piezoelectric layer in which displacement occurs by using 90° domain rotation and has excellent piezoelectric characteristics may be obtained.

It is preferable that the crystal has a crystallite diameter $D_{(002)}$ of equal to or less than 15 nm. In this case, 90° domain rotation with higher efficiency can be caused as the crystal size becomes smaller. Thus, the piezoelectric element which can have a further improved piezoelectric constant of the piezoelectric layer, and has excellent piezoelectric characteristics may be obtained.

It is preferable that a ratio ($D_{(200)}/D_{(002)}$) of a crystallite diameter $D_{(200)}$ and a crystallite diameter $D_{(002)}$ in the crystal is greater than 3. In this case, 90° domain rotation with higher efficiency can be caused as the crystallite diameter $D_{(002)}$ becomes smaller than the crystallite diameter $D_{(200)}$. Thus, the piezoelectric element which can have the further improved piezoelectric constant of the piezoelectric layer, and has excellent piezoelectric characteristics may be obtained.

It is preferable that the piezoelectric layer includes a base layer provided on the first electrode side, and the base layer has lattice mismatching rate of less than 1% with a c-axis of the composite oxide of the piezoelectric layer, and lattice mismatching rate of equal to or greater than 1% with an a-axis and a b-axis of the composite oxide. In this case, it is possible to perform easy orientation control of the piezoelectric material and to stabilize the c-axial component of the tetragonal piezoelectric material. Thus, the piezoelectric element which can have the further improved piezoelectric constant of the piezoelectric layer, and has further excellent piezoelectric characteristics may be obtained.

It is preferable that the piezoelectric layer has a lower relative dielectric constant than the base layer formed of the composite oxide. In this case, a voltage is applied to the piezoelectric layer with high efficiency. Thus, it is possible to cause 90° domain rotation with a low voltage.

It is preferable that the composite oxide in the piezoelectric layer has a ratio (c/a) of the c-axis and the a-axis which is in a range of 1.026 to 1.015. In this case, 90° domain rotation with high efficiency can be caused, and thus the piezoelectric element which can have the further improved piezoelectric constant of the piezoelectric layer, and has further excellent piezoelectric characteristics may be obtained.

It is preferable that the base layer is formed of PZT. In this case, the piezoelectric element in which orientation control of the piezoelectric material becomes easier and piezoelectric characteristics is further excellent may be obtained.

According to another aspect of the invention, there is provided an actuator device including the piezoelectric element according to any of the described above. In this case, the actuator device includes a piezoelectric element which can have an improved piezoelectric constant of a piezoelectric layer in which displacement occurs by using 90° domain rotation and has excellent piezoelectric characteristics.

According to still another aspect of the invention, there is provided a liquid ejecting head including the actuator device described above. In this case, the liquid ejecting head includes a piezoelectric element which can have an improved piezoelectric constant of a piezoelectric layer in which displacement occurs by using 90° domain rotation and has excellent piezoelectric characteristics.

According to still another aspect of the invention, there is provided a liquid ejecting apparatus including the liquid ejecting head described above. In this case, the liquid ejecting apparatus includes a piezoelectric element which can have an improved piezoelectric constant of a piezoelectric layer in which displacement occurs by using 90° domain rotation and has excellent piezoelectric characteristics.

According to still another aspect of the invention, there is provided an ultrasonic measuring apparatus including the piezoelectric element according to any of the described above; and a control section that measures a detection target by using a signal obtained based on at least one of an ultrasonic wave transmitted by the piezoelectric element and an ultrasonic wave received by the piezoelectric element. In this case, the ultrasonic measuring apparatus includes a piezoelectric element which can have an improved piezoelectric constant of a piezoelectric layer in which displacement occurs by using 90° domain rotation and has excellent piezoelectric characteristics, excellent ultrasonic wave transmitting characteristics, and excellent ultrasonic wave receiving characteristics.

BRIEF DESCRIPTION OF THE DRAWINGS

Embodiments of the invention will now be described by way of example only with reference to the accompanying drawings, wherein like numbers reference like elements.

FIG. 11 is a diagram illustrating the X-ray diffraction pattern relating to the piezoelectric element according to the example.

FIG. 12 is a diagram illustrating a relationship of a composition ratio in the example.

DESCRIPTION OF EXEMPLARY EMBODIMENTS

Hereinafter, embodiments of the invention will be described with reference to the accompanying drawings.

Embodiment 1

Figure 1:
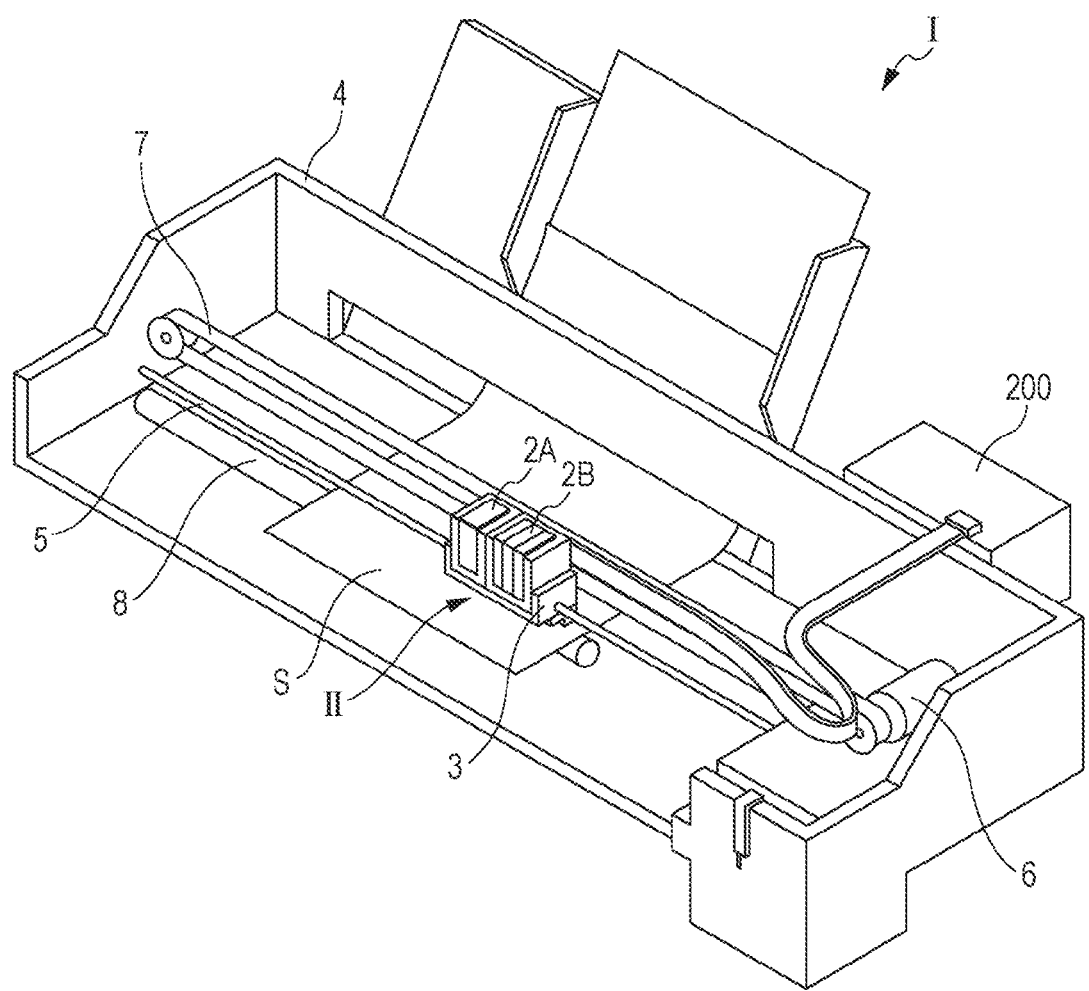
FIG. 1 is a diagram illustrating a schematic configuration of a recording apparatus according to Embodiment 1.

FIG. 1 illustrates an ink jet recording apparatus which is an example of a liquid ejecting apparatus according to Embodiment 1 of the invention.

As illustrated in FIG. 1, in an ink jet recording apparatus I, cartridges 2A and 2B constituting an ink supplying section are provided so as to be attachable and detachable in an ink jet recording head unit (head unit) II having a plurality of ink jet recording heads. The carriage 3 having the mounted head unit II is provided so as to be movable on a carriage shaft 5 attached to the apparatus body 4, in a shaft direction. The carriage 3 discharges respectively a black ink composition and a color ink composition, for example.

Driving force of the driving motor 6 is transferred to the carriage 3 through a plurality of gears (not illustrated) and a timing belt 7, and thus the carriage 3 having the mounted head unit II moves along the carriage shaft 5. A transportation roller 8 as a transportation section is provided in the apparatus body 4 and thus a recording sheet S which is a recording medium such as paper is transported by the transportation roller 8. The transportation section that transports the recording sheet S is not limited to the transportation roller, and may be a belt, a drum, or the like.

Figure 2:
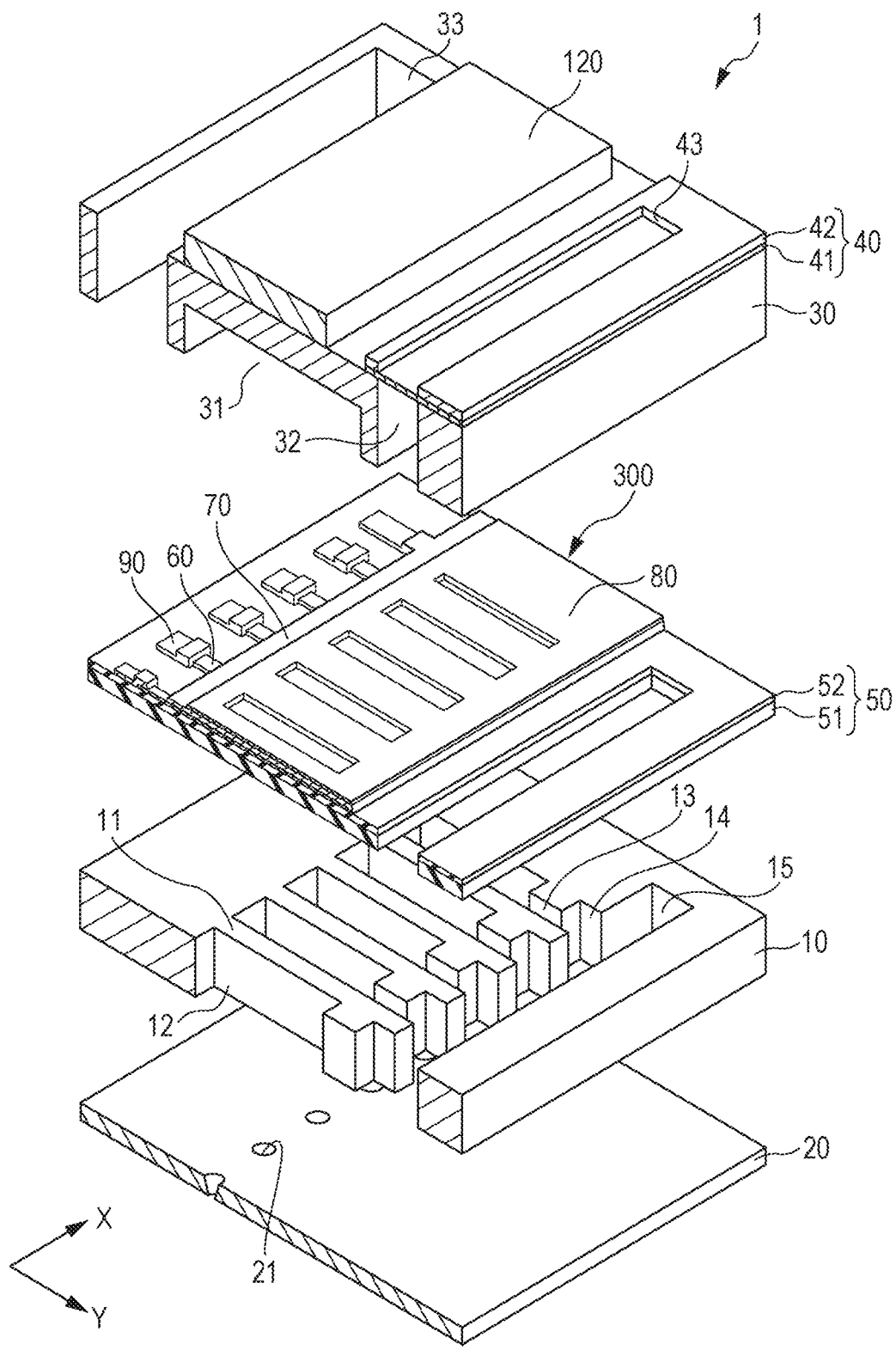
FIG. 2 is an exploded perspective view illustrating a recording head according to Embodiment 1.
Figure 3A:
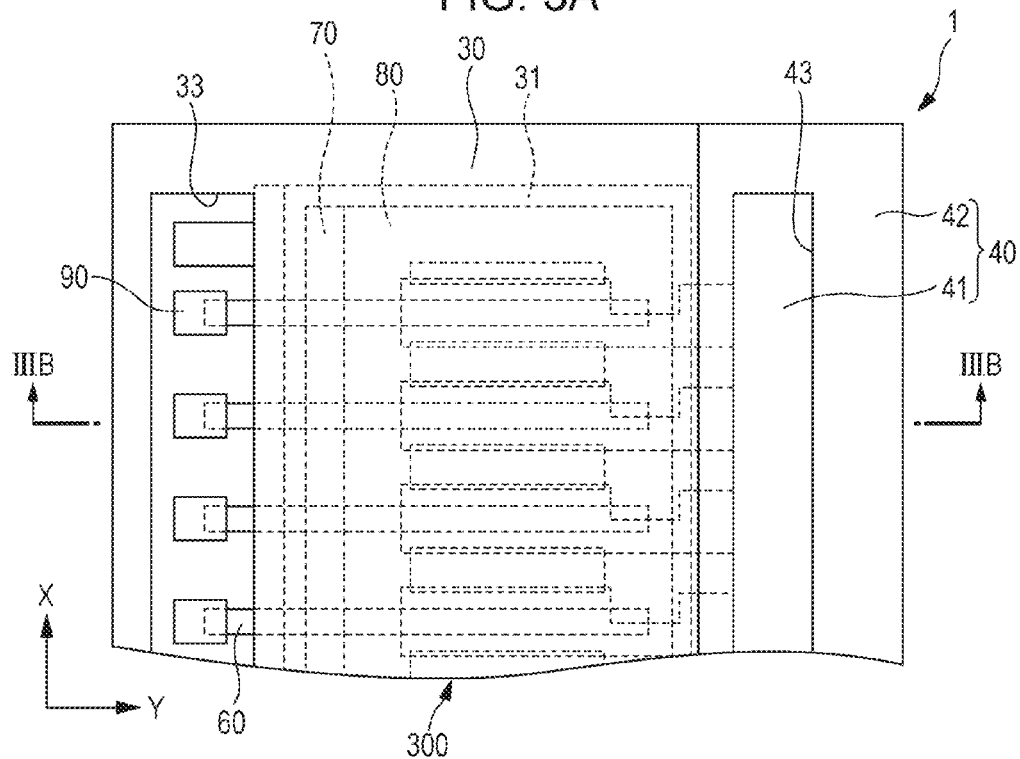
FIG. 3A is a plan view illustrating the recording head according to Embodiment 1.
Figure 3B:
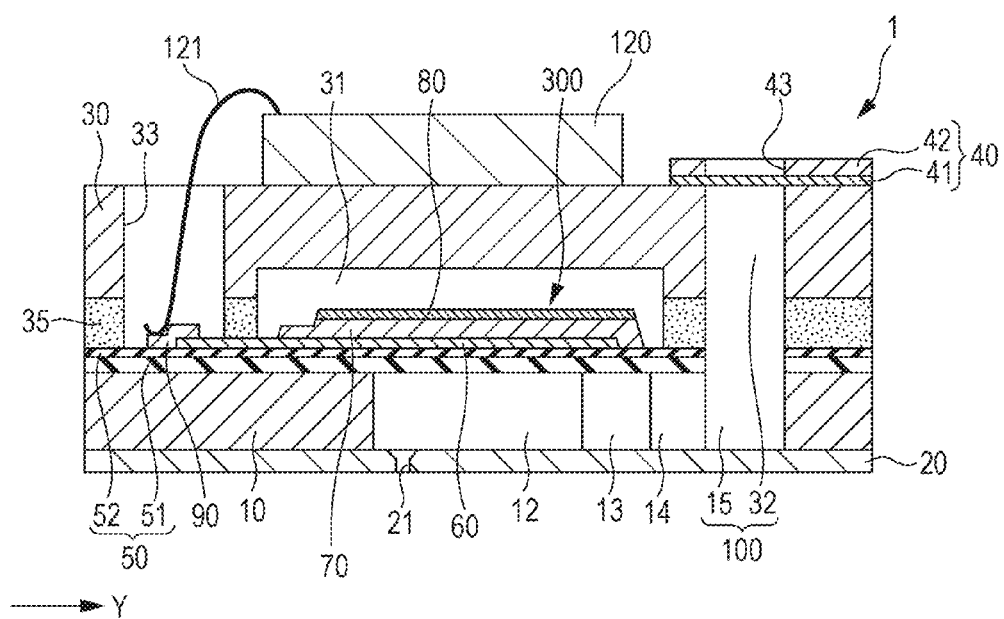
FIG. 3B is a cross-sectional view illustrating the recording head according to Embodiment 1.

Next, an example of an ink jet recording head 1 mounted in such an ink jet recording apparatus I will be described with reference to FIGS. 2 to 3B. FIG. 2 is an exploded perspective view of the ink jet recording head which is an example of a liquid ejecting head according to this embodiment. FIG. 3A is a plan view of a flow passage formation substrate on a piezoelectric element side. FIG. 3B is a cross-sectional view taken along line IIIB-IIIB in FIG. 3A.

As illustrated in FIGS. 2 to 3B, a pressure generation chamber 12 is formed in a flow passage formation substrate 10. Pressure generation chambers 12 obtained by subdivision of a plurality of walls 11 are provided in parallel along a direction in which a plurality of nozzle openings 21 discharging the same color ink are provided in parallel. This direction is referred to below as a juxtaposed direction of the pressure generation chambers 12 or as a first direction X. A direction orthogonal to the first direction X is referred below to a second direction Y.

An ink supplying passage 13 and a communication passage 14 are subdivided on one end portion side of the pressure generation chamber 12 of the flow passage formation substrate 10 in the second direction Y, by the plurality of walls 11. The ink supplying passage 13 has a small opening area by narrowing one side of the pressure generation chamber 12 from the first direction X. The communication passage 14 has substantially the same width as the pressure generation chamber 12 in the first direction X. A communication portion 15 is formed on the outside of the communication passage 14 (on an opposite side of the pressure generation chamber 12 in the second direction Y). The communication portion 15 constitutes a portion of a manifold 100 which is a common ink chamber of the pressure generation chambers 12. That is, a liquid flow passage which is configured from the pressure generation chamber 12, the ink supplying passage 13, the communication passage 14, and the communication portion 15 is formed in the flow passage formation substrate 10.

A nozzle plate 20 is bonded to one surface side of the flow passage formation substrate 10 (that is, a surface in which the liquid flow passage of the pressure generation chamber 12 and the like is opened) by using an adhesive, a heat welding film, or the like. In the nozzle plate 20, nozzle openings 21 for respectively communicating with the pressure generation chambers 12 are provided. The nozzle openings 21 in the nozzle plate 20 are provided in parallel in the first direction X.

A vibration plate 50 is formed on another surface side facing one surface side of the flow passage formation substrate 10. The vibration plate 50 may be configured by an elastic film 51 and an insulating film 52, for example. The elastic film 51 is provided on the flow passage formation substrate 10 and the insulating film 52 is provided on the elastic film 51. However, the vibration plate 50 is not limited to the example, and a result of thinning a portion of the flow passage formation substrate 10 may be used as the elastic film.

A piezoelectric element 300 is formed on the insulating film 52 with an adhesion layer formed of, for example, titanium interposed therebetween. The piezoelectric element 300 is configured by a first electrode 60, a piezoelectric layer 70, and a second electrode 80. However, the adhesion layer may be omitted.

In this embodiment, the piezoelectric element 300 and the vibration plate 50 together are referred to as an actuator device. The vibration plate 50 has displacement occurring by driving the piezoelectric element 300. The vibration plate 50 and the first electrode 60 function as a vibration plate, but it is not limited thereto. In addition, only the first electrode 60 may function as the vibration plate without providing either or both of the elastic film and the insulating film 52. The piezoelectric element 300 itself may be also used as the substantive vibration plate. When the first electrode 60 is directly provided on the flow passage formation substrate 10, the first electrode 60 is preferably protected by an insulating protective film and the like such that the first electrode 60 and an ink are not electrically connected.

In such a piezoelectric element 300, either of the electrodes is generally set as a common electrode and the other electrode is set as an individual electrode obtained by patterning in respect of each of the pressure generation chambers 12. In this embodiment, the first electrode 60 is set as the individual electrode and the second electrode 80 is set as the common electrode. However, converse setting may be performed for convenience of a driving circuit 120 or a connection wiring 121. In this embodiment, the second electrode 80 is continuously formed over the plurality of the pressure generation chamber 12, and thus is set as the common electrode.

The second electrode 80 is provided on an opposite side of the piezoelectric layer to the first electrode 60. A material of the first electrode 60 or the second electrode 80 is not particularly limited as long as the material has conductivity. Precious metal such as platinum (Pt) and iridium (Ir) may be appropriately used as the material.

A protective substrate 30 is bonded onto the flow passage formation substrate 10 on which the piezoelectric element 300 is provided, that is, over the vibration plate 50, the first electrode 60, and a lead electrode 90, by using an adhesive 35. The protective substrate 30 has a manifold portion 32 which constitutes at least a portion of the manifold 100. In this embodiment, the manifold portion 32 is formed in a width direction of the pressure generation chamber 12 by hollowing out the protective substrate 30 in a thickness direction. In this manner, the manifold 100 which functions as a common ink chamber of the pressure generation chambers 12, which communicates with the communication portion 15 of the flow passage formation substrate 10 is configured. The communication portion 15 of the flow passage formation substrate 10 may be divided into a plurality of communication portions which are assigned for the pressure generation chambers 12 and only the manifold portion 32 may be used as a manifold. For example, only the pressure generation chamber 12 may be provided in the flow passage formation substrate 10, and the ink supplying passage 13 for causing the manifold and each of the pressure generation chambers 12 to communicate with each other may be provided in the elastic film 51 and the insulating film 52 which are interposed between the flow passage formation substrate 10 and the protective substrate 30.

A piezoelectric element holding portion 31 is provided in the protective substrate 30. The piezoelectric element holding portion 31 has a space of an extent that motion of the piezoelectric element 300 is not disturbed, in an area facing the piezoelectric element 300. The piezoelectric element holding portion 31 may have the space of an extent that motion of the piezoelectric element 300 is not disturbed and the space may or may not be air-tightly sealed. A driving circuit 120 functioning as a signal processing unit is fixed to the protective substrate 30. The driving circuit 120 may use, for example, a circuit board, a semiconductor integrated circuit (IC), or the like, and is connected to a printer controller (reference signal of 200 illustrated in FIG. 1). The driving circuit 120 and the lead electrode 90 may be electrically connected to each other through a connection wiring 121 which is formed from a conductive wire such as a bonding wire which is inserted into a through-hole 33.

A compliance substrate 40 is bonded onto the protective substrate 30. The compliance substrate 40 is formed from a sealing film 41 and a fixing plate 42. The sealing film 41 is formed of a material having low rigidity and this sealing film 41 causes one surface of the manifold portion 32 to be sealed. The fixing plate 42 may be formed of a rigid material such as metal. Since an area facing the manifold 100 of the fixing plate 42 is completely removed in the thickness direction and thus becomes an opening portion 43, one surface of the manifold 100 is sealed by only the sealing film 41 having flexibility.

Figure 4:
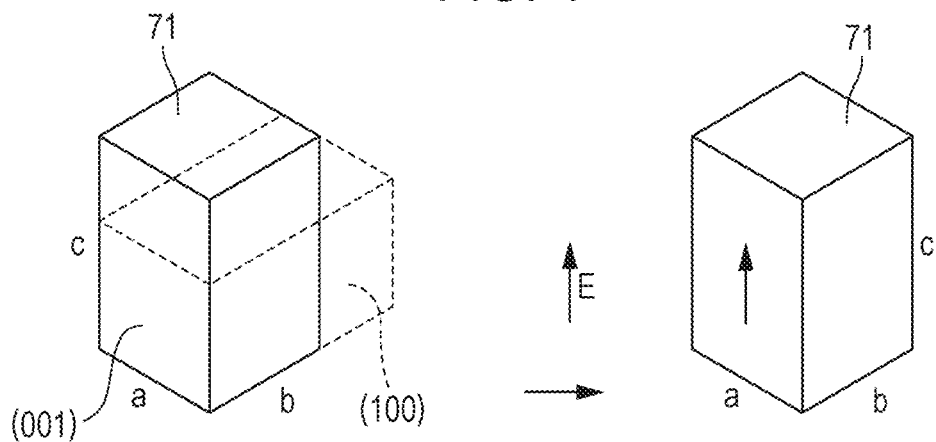
FIG. 4 is a diagram illustrating a piezoelectric element according to Embodiment 1.
Figure 5:
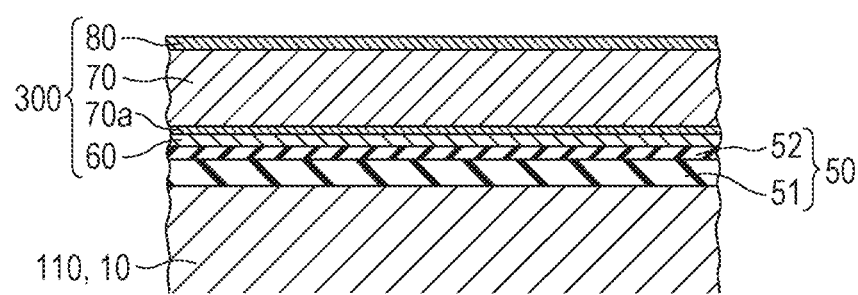
FIG. 5 is a cross-sectional view illustrating the piezoelectric element according to Embodiment 1.

The piezoelectric element according to this embodiment will be described with reference to FIGS. 4 to 5. FIG. 4 is a diagram illustrating a so-called 90° domain rotation and the like and FIG. 5 is a diagram illustrating an example of this embodiment which further includes a predetermined base layer.

In the piezoelectric element 300 according to this embodiment, the first electrode 60, the piezoelectric layer 70, and the second electrode 80 are sequentially stacked. The piezoelectric layer 70 has a tetragonal crystal structure. This crystal is oriented to {100} against the flow passage formation substrate 10 and areas, each area including (100) plane and (001) plane orthogonal to a stacking direction, are mixed in the crystal lattice. The stacking direction may be the same as a thickness direction of the piezoelectric element 300 and corresponds to a direction orthogonal to any one of the first direction X and the second direction Y.

The piezoelectric layer 70 contains tetragonal ceramics in which $Pb(M'_{1/3}, Nb_{2/3})O_3$ which is pseudo-cubic and $PbM''O_3$ which is tetragonal are dissolved, and is formed of composite oxide which is represented by the following general expression (1). In such a perovskite structure, that is, an $ABO_3$ structure, oxygen forms the 12-folod coordination in the A site and oxygen forms the 6-foled coordination in the B site and thereby an octahedron is obtained. In the general expression (1), Pb is positioned in the A site, and Nb, M', and M'' are positioned in the B site. As M', types of metal having bi-valence, such as Mg, Mn, Fe, Ni, Co, and Zn may be used. As M'', types of metal having tetra-valence, such as Ti and Zr may be used. In this disclosure, Ni is used as M', and Zr and Ti are used as M".

That is, in this embodiment, the piezoelectric layer 70 contains tetragonal ceramics in which niobate nickel lead (Pb(Ni, Nb)O$_3$; PNN), and lead zirconate and lead titanate (PbZrO$_3$ and PbTiO$_3$; PZT) are dissolved. The piezoelectric layer 70 is formed of composite oxide represented by the following general expression (2), in which more lead is contained than required for stoichiometry of the ABO$_3$ structure. Thus, the piezoelectric constant may be further improved.

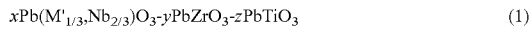

$$x\text{Pb}(\text{M}'_{1/3}, \text{Nb}_{2/3})\text{O}_3\text{-}y\text{PbZrO}_3\text{-}z\text{PbTiO}_3 \quad (1)$$

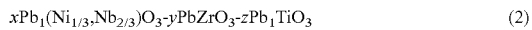

$$x\text{Pb}_1(\text{Ni}_{1/3}, \text{Nb}_{2/3})\text{O}_3\text{-}y\text{PbZrO}_3\text{-}z\text{Pb}_1\text{TiO}_3 \quad (2)$$

(in the general expressions (1) and (2), 10≤x≤40, 0<y≤40, and 50≤z≤90)

Descriptions of the expressions are composition notations based on the stoichiometry, and replacement of some of elements is allowable in addition to lattice mismatching performance or inevitable composition deviation due to a loss of some of elements, as long as the piezoelectric layer has the Perovskite structure. For example, if a stoichiometric ratio is set to 1, a range of 0.85 to 1.20 is allowable. The metal type of M' or M" is not independently limited, and various types may be used as long as Ni is used as M', Zr and Ti is used as M" without a range departing from the scope of the invention as defined in the claims.

As illustrated in FIG. 4, in the piezoelectric layer 70, domains 71, each domain including (100) plane and (001) plane orthogonal to the stacking direction (the thickness direction of the piezoelectric element 300) are mixed in the crystal lattice. Applying of an electric field E causes the tetragonal a-axial component and tetragonal b-axial component to be rotated by 90° against the c-axial component, and thus piezoelectric characteristics are shown. Particularly, in this embodiment, the crystallite diameter D$_{(002)}$ of crystals in the piezoelectric material is equal to or less than 20 nm and preferably, 15 nm. A ferroelectric domain 71 (so-called nano domain) is formed in each of columnar particles which are disposed with a baking interface interposed therebetween and constitute a thin film. Accordingly, it is possible to cause 90° domain rotation with high efficiency and thus it is possible to further improve the piezoelectric constant of the piezoelectric layer.

A piezoelectric layer in which 90° domain rotation is not performed has been known in addition to the piezoelectric layer 70 in which displacement occurs by using such 90° domain rotation. However, this piezoelectric layer is fundamentally different from the piezoelectric layer in this embodiment in that displacement does not occur by an angular relationship such as 90° domain rotation.

In addition to the piezoelectric layer 70 according to this embodiment, a piezoelectric layer (for example, PZT) that shows piezoelectric characteristics by inducing of electric dipole moment in the ferroelectric domain realizes a predetermined composition ratio by using properties in which the piezoelectric constant becomes significantly greater in the vicinity of a border of morphotropic phase change in the crystal structure, in many cases. In the piezoelectric layer 70 using 90° domain rotation, particularly, in a range of the composition ratio, the displacement thereof is significantly larger than that of the PZT according to this embodiment. However, it will be confirmed in the following example.

As illustrated in FIG. 5, the piezoelectric layer according to this embodiment includes a base layer 70a provided on the first electrode 60 side. The base layer 70a has lattice mismatching rate of less than 1% with the c-axis of the composite oxide of the piezoelectric layer 70, and lattice mismatching rate of equal to or greater than 1% with the a-axis and the b-axis of the composite oxide. According to this configuration, it is possible to perform easy orientation control of the piezoelectric material and to stabilize the c-axial component of the tetragonal piezoelectric material. Thus, it is possible to further improve the piezoelectric constant of the piezoelectric layer.

The base layer 70a may have an ABO$_3$ crystal structure which has a composition different from that of the tetragonal composite oxide of the piezoelectric layer 70. Here, PZT is employed. According to PZT, it is possible to easily realize a structure in which a compound having a relative dielectric constant higher than the PZT comes into contact with the piezoelectric layer 70 having a structure, for example, represented by the general expression (2). Thus, further improvement of the piezoelectric layer is easily obtained.

It may be preferable that a lattice mismatching rate of the c-axial component of the tetragonal composite oxide of the piezoelectric layer 70 and the PZT (base layer 70a) is equal to or less than 0.82%, and a lattice mismatching rate of the a-axial component and the b-axial component of the tetragonal composite oxide of the piezoelectric layer 70, and the PZT is equal to or more than 1.18%. It may be more preferable that a lattice mismatching rate of the c-axial component of the tetragonal composite oxide of the piezoelectric layer 70 and the PZT (base layer 70a) is equal to or more than 0.14% and equal to or less than 0.82%, and a lattice mismatching rate of the a-axial component and the b-axial component of the tetragonal composite oxide of the piezoelectric layer 70, and the PZT is equal to or more than 1.18% and equal to or less than 3.11%. Thus, it is possible to obtain further improvement of the piezoelectric constant.

The thickness of the base layer 70a may be appropriately set considering a thickness necessary for the piezoelectric layer 70. In FIG. 5, the base layer 70a is formed between the piezoelectric layer 70 and the first electrode 60. However, it is not limited to the above-described example as long as the structure in which the piezoelectric layer 70 comes into contact with the base layer 70a on the first electrode 60 side is made. In addition, the total number of the base layers 70a is also not limited. For example, a configuration in which the piezoelectric layer 70 and the base layer 70a are alternately stacked may be made. According to this configuration, it is possible to increase a contact area of the piezoelectric layer 70 and the base layer 70a.

Next, an example of a manufacturing method of the piezoelectric element according to this embodiment will be described along with an example of a manufacturing method of an ink jet recording head having the mounted piezoelectric element, with reference to FIGS. 6A to 7C.

First, the vibration plate 50 is formed on a surface of a flow passage formation substrate wafer 110 which is a silicon wafer. In this embodiment, the vibration plate 50 is formed in such a manner that silicon dioxide (elastic film 51) is formed by performing thermal oxidation on the flow passage formation substrate wafer 110, zirconium oxide (insulating film 52) is formed by performing thermal oxidation after a film is formed by using a sputtering method, and thus the silicon dioxide and zirconium oxide are stacked. Although not illustrated in FIG. 6A, in this embodiment, an adhesion layer is formed on the vibration plate 50. However, this adhesion layer may be omitted.

Then, the first electrode 60 is formed on the entire surface of the adhesion layer on the vibration plate 50. This first electrode 60 may be formed by using, for example, a sputtering method, a PVD (physical evaporation method), vapor phase film deposition such as a laser ablation method, liquid phase film deposition such as a spin coating method, and the like. Then, the base layer 70*a* is formed on the first electrode 60. A forming method of the base layer 70*a* is not limited. However, the base layer may be manufactured by using, for example, a metal-organic decomposition (MOD) method, and using a chemical solution method such as a sol-gel method. In the above-described methods, a liquid containing metallic complex is applied and dried, and baked at a high temperature, and thus metal oxide is obtained, and the base layer is formed of obtained metal oxide. The base layer 70*a* may be manufactured by using a liquid phase method or a solid phase method such as a laser ablation method, a sputtering method, a pulse laser deposition (PLD) method, a CVD method, and an aerosol deposition method. The base layer 70*a* may be omitted as necessary.

Figure 6A:
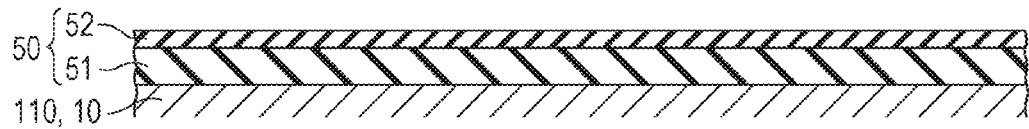
FIGS. 6A to 6D are cross-sectional views illustrating a structure example of the piezoelectric element and the recording head according to Embodiment 1.
Figure 6B:
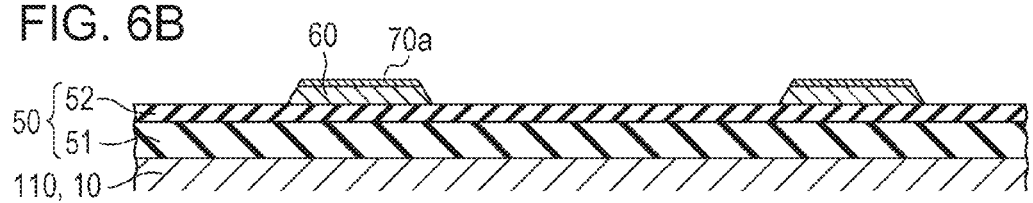

Then, as illustrated in FIG. 6B, the first electrode 60 and the base layer 70*a* are simultaneously patterned. Here, patterning may be performed by dry etching such as reactive ion etching (RIE) and ion milling. The base layer 70*a* may be formed or omitted as necessary after only the first electrode 60 is patterned. In addition, the first electrode 60 and the base layer 70*a* may be patterned simultaneously with the piezoelectric layer 70 which will be described later, without patterning of the first electrode 60 and the base layer 70*a*.

Then, the piezoelectric layer 70 is stacked. A forming method of the piezoelectric layer 70 is not limited. However, the piezoelectric layer may be manufactured by using, for example, a MOD method, or using a chemical solution method such as a sol-gel method. In the above-described methods, a liquid containing metallic complex is applied and dried, and baked at a high temperature, and thus metal oxide is obtained, and the piezoelectric layer (piezoelectric film) is formed of obtained metal oxide. The piezoelectric layer 70 may be manufactured by using a liquid phase method or a solid phase method such as a laser ablation method, a sputtering method, a PLD method, a CVD method, an aerosol deposition method.

Figure 6C:
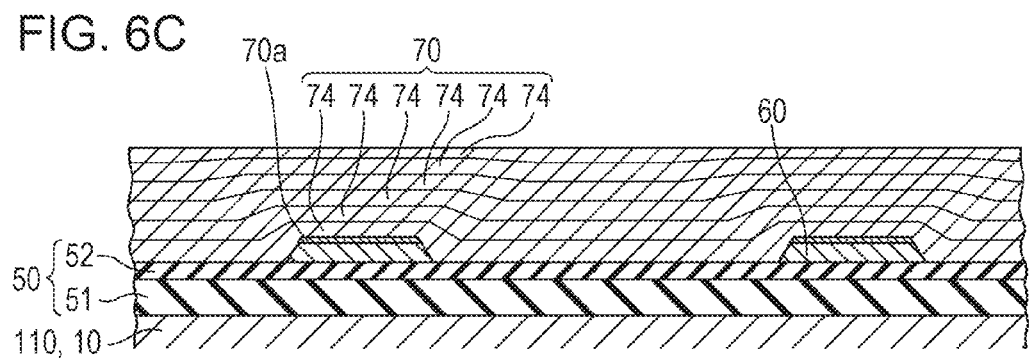

An example of specific forming procedures when the piezoelectric layer 70 is formed by using the chemical solution method is as follows. That is, a precursor solution for forming the piezoelectric layer 70 is made by using an MOD solution or a sol containing metallic complex. This precursor solution is applied on the first electrode 60 by using a spin-coating method and the like, and thereby a precursor film 74 is formed (application process). This precursor film is dried for a predetermined period of time by performing heating at a predetermined temperature (dry process). The dried precursor film is heated at a predetermined temperature and held for a predetermined period of time, and thereby degreasing is performed (degreasing process). The precursor film is crystalized by performing heating and holding at a predetermined temperature, and thereby the piezoelectric layer 70, preferably comprising a plurality of precursor films 74, illustrated in FIG. 6C is formed (baking process).

A solution applied in the above application process is obtained in such a manner that metallic complex for forming a composite oxide-layer precursor film which contains Pb, Ni, Nb, Zr, and Ti, by performing baking is mixed, and the mixture is dissolved or dispersed in an organic solvent. As the metallic complex containing Pb, lead acetate and the like are included. As the metallic complex containing Ni, nickel acetate and the like are included. As the metallic complex containing Nb, penta-n-butoxyniobium and the like are included. As the metallic complex containing Zr, zirconium (IV) acetylacetonate and the like are included. As the metallic complex containing Ti, titanium tetra-isopropoxide and the like are included.

Figure 6D:
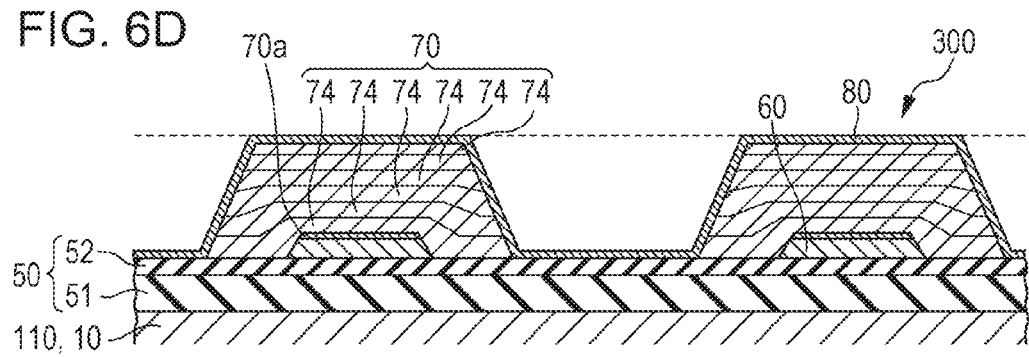

After the piezoelectric layer 70 has been formed, as illustrated in FIG. 6D, the second electrode 80 formed of platinum is formed on the piezoelectric layer 70 by using a sputtering method. Patterning for the piezoelectric layer 70 and the second electrode 80 is simultaneously performed on an area facing each of the pressure generation chambers 12, and thus the piezoelectric element 300 which is configured from the first electrode 60, the piezoelectric layer 70, and the second electrode 80 is formed. Alternatively, as shown in FIG. 6D, the piezoelectric layer 70 may be patterned (at least partially) before the second electrode 80 is formed.

Figure 7A:
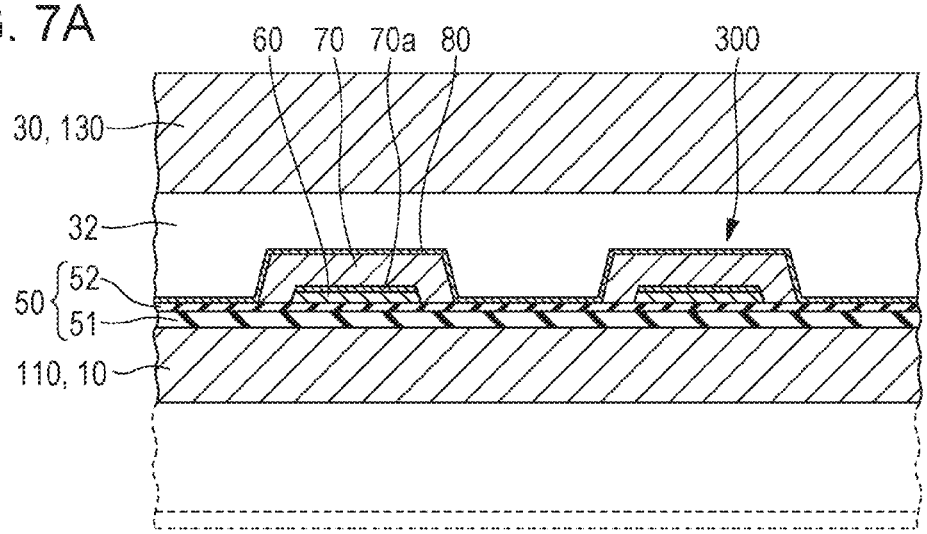
FIGS. 7A to 7C are cross-sectional views illustrating a structure example of the piezoelectric element and the recording head according to Embodiment 1.
Figure 7B:
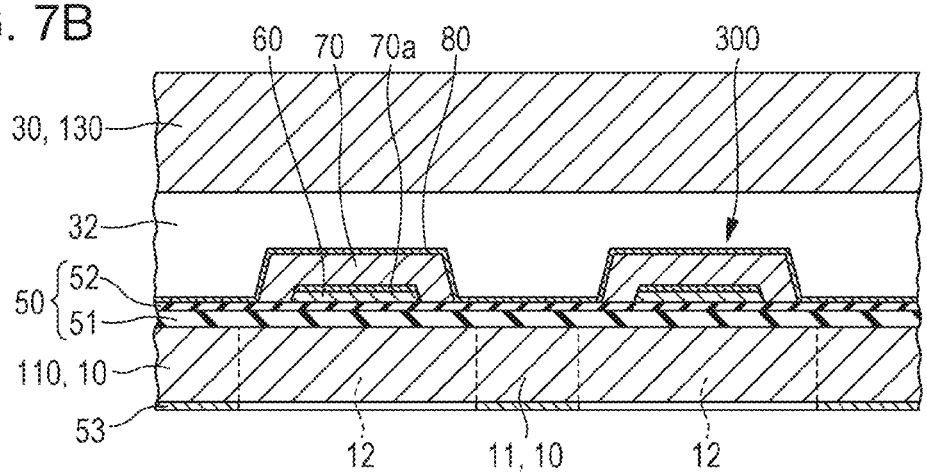
Figure 7C:
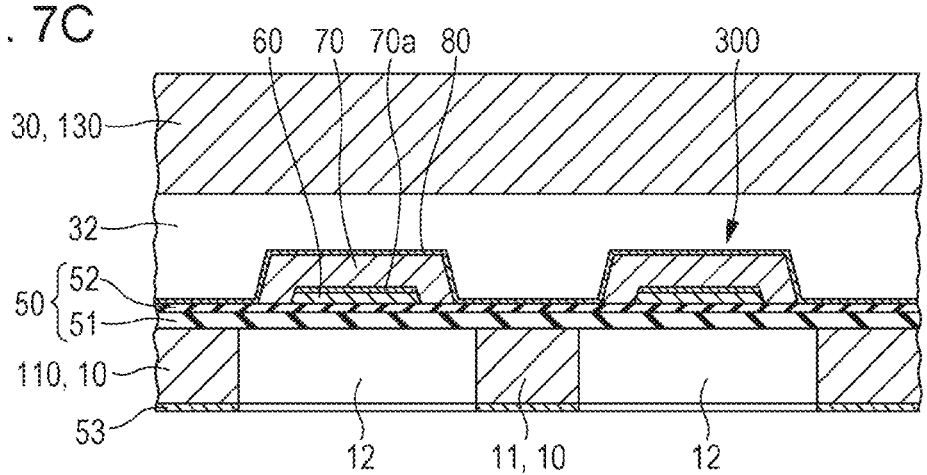

Then, as illustrated in FIG. 7A, a protective substrate wafer 130 is bonded onto the piezoelectric element 300 side of the flow passage formation substrate wafer 110. The protective substrate wafer 130 is a silicon wafer and forms a plurality of protective substrates 30. Then, the flow passage formation substrate wafer 110 is thinned so as to have a predetermined thickness. As illustrated in FIG. 7B, a new mask film 53 is formed on the flow passage formation substrate wafer 110 and patterning is performed so as to have a predetermined shape. The flow passage formation substrate wafer 110 is subjected to anisotropic etching (wet etching) through the mask film 53 by using an alkaline solution such as KOH, and thus the pressure generation chamber 12 and the like corresponding to the piezoelectric element 300 is formed, as illustrated in FIG. 7C.

Then, unnecessary portions of outer circumferences of the flow passage formation substrate wafer 110 and the protective substrate wafer 130 are removed in the usual manner by performing cutting such as dicing. After the mask film 53 on an opposite side of the protective substrate wafer 130 of the flow passage formation substrate wafer 110 is removed, the nozzle plate in which the nozzle openings are provided is bonded and the compliance substrate is bonded to the protective substrate wafer 130. Then, the flow passage formation substrate wafer 110 and the like is divided into the flow passage formation substrates 10 and the like having one chip size as illustrated in FIG. 2, and thereby a recording head is obtained.

Figure 8A:
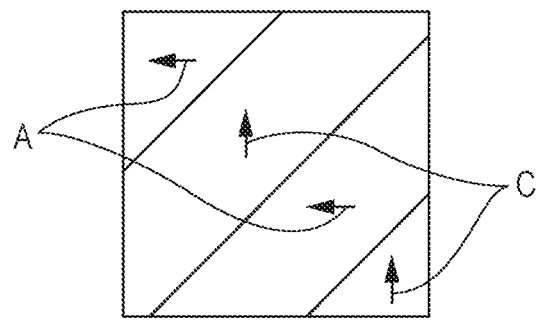
FIGS. 8A and 8B are diagrams illustrating a domain structure according to Embodiment 1.

As described above, the example of the manufacturing method of the piezoelectric element according to this embodiment is described along with the example of the manufacturing method of the recording head. Generally, in a piezoelectric body having a tetragonal structure, internal stress is relieved due to a length ratio (c/a) of the c-axis and the a-axis. Thus, 90° domain is formed, as illustrated in FIG. 8A. At this time, an existing probability of a C domain and an A domain is substantially 1:1 in the ideal state in which an influence of an external field is not received. The C domain (domain having polarization in a direction orthogonal to a surface) is indicated by a reference sign of C in FIG. 8A and the A domain (domain having polarization in an inward direction of the surface) is indicated by a reference sign of A in FIG. 8A.

Figure 8B:
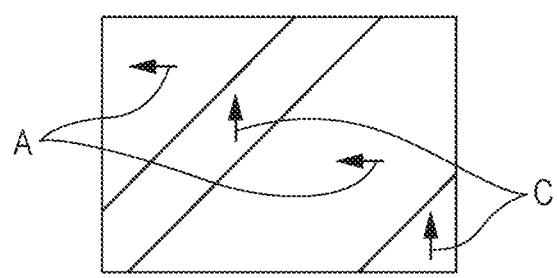

In this embodiment, the piezoelectric layer 70 is formed by using an application method, for example, by applying the precursor solution. For this reason, a solvent and ligands are decomposed/released from the precursor solution and thus a film volume is contracted. Tensile stress is applied to the precursor film due to such a contraction and a difference between thermal expansion coefficients of the substrate and the precursor film. Accordingly, the piezoelectric layer 70 has a structure in which extension is performed in a substrate surface, in comparison to a case where there is no stress. That is, in this embodiment, there is an external field which causes the A domain to be easily formed. Thus, it is basically difficult to form stable 90° domain and there is a constant number of metastable A domains having high energy against the internal stress, as illustrated in FIG. 8B. The constant number of such A domains existing is clarified by using an X-ray diffraction measurement result of the piezoelectric layer 70, for example.

Here, in this embodiment, it is confirmed that adjacent domains have different directions, that is, crystal particles form a sandy shape, in a state where a voltage is not applied. These sandy crystal particles cause a relatively stable state against the internal stress to be obtained. When a voltage is applied, it is confirmed that adjacent domains have the same domain direction due to domain rotation, that is, the crystal particles form a stripe shape. In this manner, crystal particles forming a sandy shape or crystal particles forming a stripe shape are obtained by performing processing for rearranging domains, such as processing of applying a predetermined voltage.

EXAMPLE

Hereinafter, the invention will be specifically described with examples. The invention is not limited to the following examples.

Example 1

Preparation of PZT Precursor Solution (Precursor Solution for Base Layer 70a)

Acetic acid and water were put in a container and then, lead acetate, zirconium tetra-n-butoxide, and titanium tetraisopropoxide were put in the container. Then, these substances were heated and stirred at 90° C., and thereby a precursor solution was manufactured.

Preparation of PNN-PZT Precursor Solution (Precursor Solution for Piezoelectric Layer)

Then, 2-n-butoxyethanol, 2,2" iminodiethanol, and polyethylene glycol were put in a container containing PZT precursor solution and thereby a solution mixture was manufactured. Titanium tetra-isopropoxide, penta-n-butoxyniobium, and zirconium (IV) acetylacetonate were put in a glove box which is filled with dried nitrogen, and mixed with the solution mixture. Then, after stirring was sufficiently performed at the room temperature, nickel acetate and lead acetate were put in a result of stirring under the atmosphere and heated and stirred at 90° C. Accordingly a PNN-PZT precursor solution was manufactured. Titanium tetra-isopropoxide, penta-n-butoxyniobium, zirconium (IV) acetylacetonate, nickel acetate, and lead acetate were prepared such that x, y, and z have proportions illustrated in Table 1 in accordance with a composition represented by the general expression (2).
Manufacturing of First Electrode, Piezoelectric Layer, and Second Electrode 6 inch silicon substrate was subjected to thermal oxidation and thus a silicon dioxide film was formed. Then, a zirconium film was manufactured by using a sputtering method and the manufactured zirconium film was subjected to thermal oxidation, and thus a zirconium oxide film (insulating film 52) was manufactured. Deposition of titanium, platinum, iridium, titanium was performed on the insulating film 52 in this order by using sputtering method, and thereby the first electrode 60 was manufactured.

The PZT precursor solution was applied by using a spin-coating method, and then drying/degreasing was performed at 140° C. and 370° C. Thus, a degreased film was manufactured. Heating processing was performed on the degreased film at 737° C. by using a rapid thermal annealing (RTA) apparatus, and thus a ceramics film (base layer 70a) formed of the PZT was manufactured. Then, after the PNN-PZT precursor solution was applied onto the ceramics film by using a spin-coating method, drying/degreasing was performed at 180° C. and 350° C., and thus, a degreased film was manufactured. Heating processing was performed on the degreased film at 750° C. by using the RTA apparatus, and thus a ceramics film (precursor film 74) formed of the PNN-PZT was manufactured. A process of manufacturing this ceramics film was carried out six times, and thus the piezoelectric layer 70 in which six ceramics films (precursor film 74) are formed on the ceramics film (base layer 70a) was manufactured.

A metallic mask was fixed onto the piezoelectric layer 70 and thus a platinum film was manufactured by a sputtering method. Then, the metallic mask was removed and baking processing for an electrode was performed at 650° C. by using the RTA apparatus. Thus, the second electrode was manufactured. The piezoelectric element 300 in which the first electrode 60, the piezoelectric layer 70, and the second electrode 80 were sequentially stacked was manufactured through the above processes.

Examples 2 to 10 and Examples 11 to 25

Processes similar to Example 1 were performed such that x, y, and z in a composition represented by the general expression (2) have proportions illustrated in Table 1 through, and thus piezoelectric elements 300 according to Examples 2 to 10 were manufactured. Processes were performed such that x, y, and z in a composition represented by the general expression (2) have proportions illustrated in Table 2, and thus piezoelectric elements 300 according to Examples 11 to 25 were manufactured. The piezoelectric elements 300 in Examples 11 to 25 satisfies relationships of $22 \leq x \leq 38$, $0 < y \leq 22$, and $56 \leq z \leq 72$ in the above general expression (2).

Comparative Examples 1 to 6

Figure 9A:
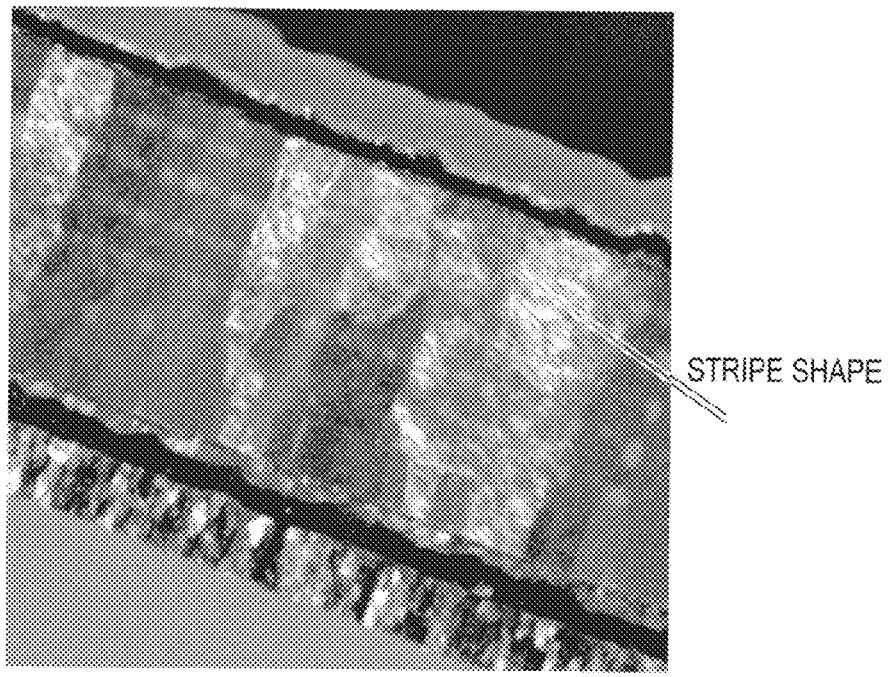
FIGS. 9A and 9B are SEM images illustrating a section of a piezoelectric layer of the piezoelectric element according to an example.
Figure 9B:
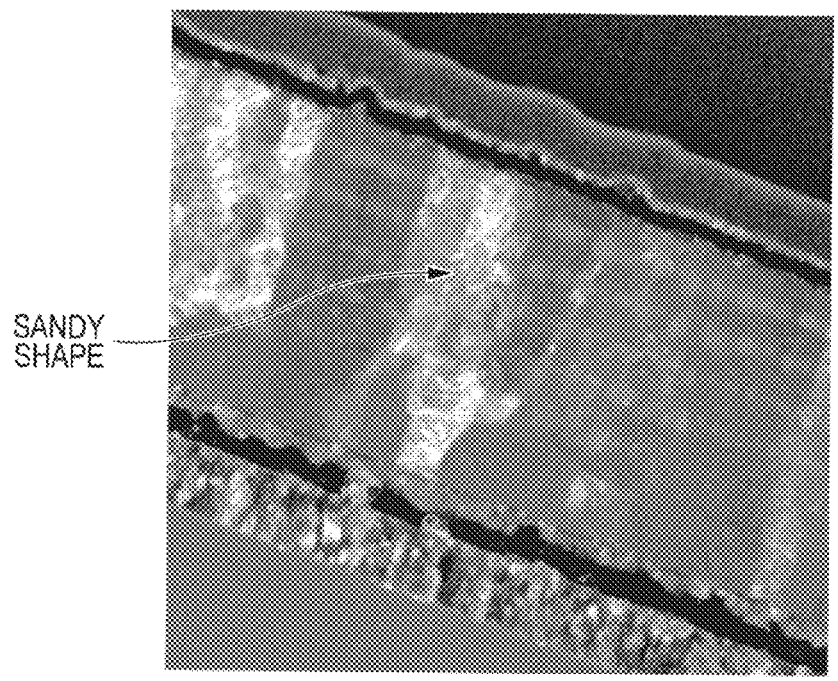

Manufacturing was performed similarly to Example 1 except that processes were performed such that x, y, and z in a composition represented by the general expression (2) have proportions illustrated in Table 1, and thus a piezoelectric element in which $PbZrO_3$ was not contained was manufactured. Thus, piezoelectric elements according to Comparative Examples 1 to 5 were manufactured. A piezoelectric element according to Comparative Example 6 was manufactured by using a piezoelectric layer formed of lead zirconate titanate (PZT).
Evaluation Details
Observation with Scanning Electron Microscope A sectional surface of the piezoelectric layer in Example 2 was observed by using a scanning electron microscope (SEM). FIGS. 9A and 9B illustrate SEM images. FIG. 9A is an SEM image of the piezoelectric layer in a state where a voltage was applied. FIG. 9B is an SEM image of the piezoelectric layer in a state where a voltage was not applied. As illustrated in FIGS. 9A and 9B, when a voltage is applied, it is understood that adjacent domains have the same direction, that is, crystal particles forming a stripe shape are confirmed (FIG. 9A). In a state where a voltage is not applied, it is understood that adjacent domains have different directions, that is, crystal particles forming a sandy shape is confirmed (FIG. 9B). In Example 2, performing of processing for rearranging domains, such as processing of applying a predetermined voltage was not particularly required. Thus, in the piezoelectric layers according to this embodiment, subsequent to Example 2, it is possible to cause appropriate displacement to occur by using 90° domain rotation even though such processing is not performed.

X-Ray Diffraction Measurement Using a Two-Dimensional Detector

Regarding crystal structures and orientations according to Examples 1 to 25, a 2D mapping image and a diffraction pattern were measured by using "D8 Discover" which is a product manufactured by Bruker AXS Corporation, using CuKα as a beam source, and using a two-dimensional detector (GADDS) as a detector. Because a range of allowing detection as an image is limited to a configuration of the apparatus, φ corresponds to 2θ=22.5° at which a (100) peak is detected is ±30°, φ corresponds to 2θ=40° at which a (111) peak is detected is ±26°. A (200) peak is detected, but this (200) plane is equivalent to the (100) plane.

Figure 10:
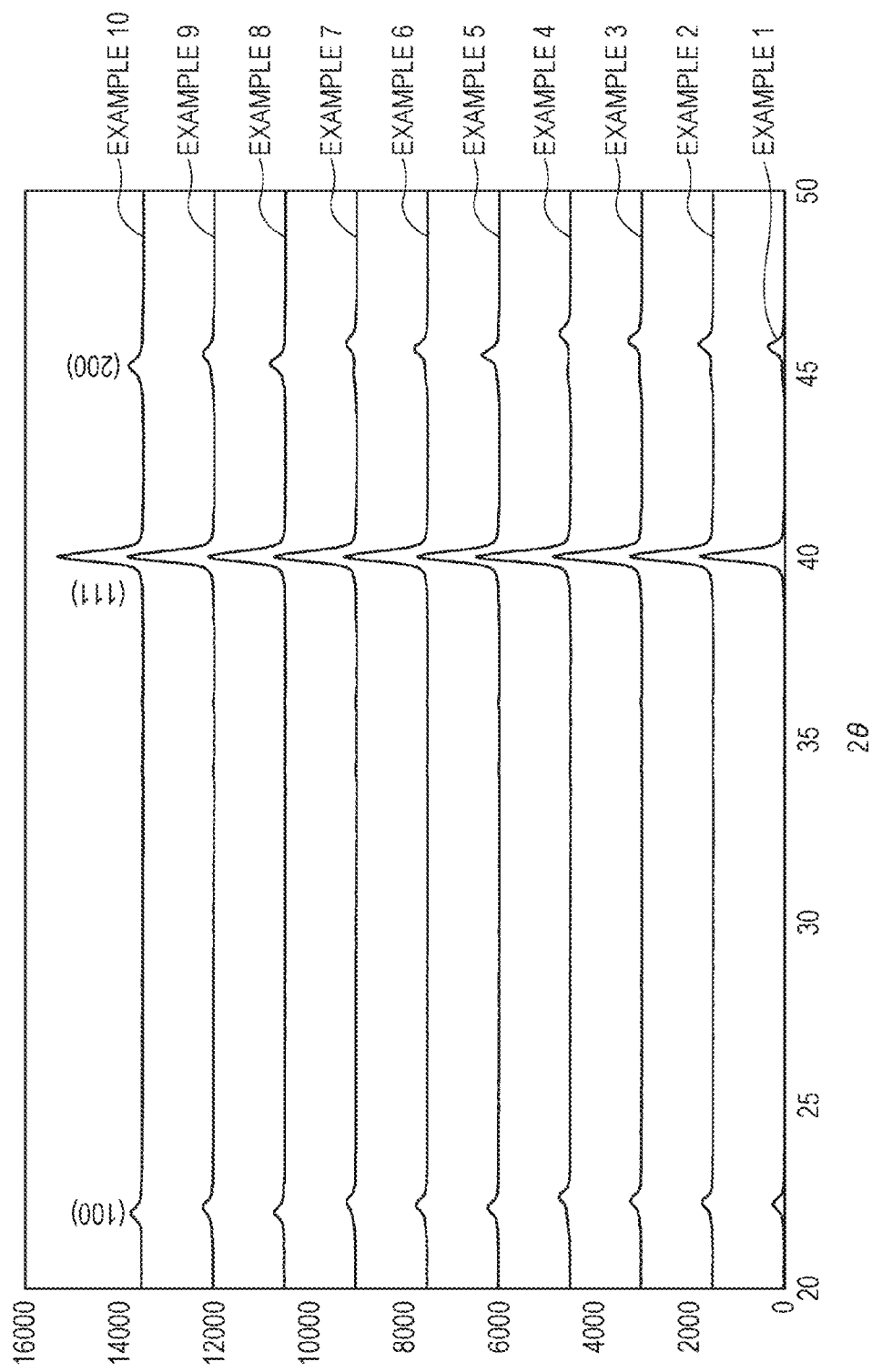
FIG. 10 is a diagram illustrating an X-ray diffraction pattern relating to the piezoelectric element according to the example.

FIG. 10 illustrates X-ray diffraction patterns of Examples 1 to 10 which were measured before the second electrode 80 was manufactured. FIG. 11 illustrates X-ray diffraction patterns of Examples 11 to 25 which were measured before the second electrode 80 was manufactured. As illustrated in FIGS. 10 and 11, in Examples 1 to 25, only a peak of the substrate itself and a peak due to the $ABO_3$ structure were observed and the other peaks due to any phases other than the substrate and $ABO_3$ was not observed.

In Examples 1 to 25, performing of processing for rearranging domains, such as processing of applying a predetermined voltage was not particularly required. Thus, it is possible to cause appropriate displacement to occur by using 90° domain rotation even though such processing is not performed.

Composition Dependence of Crystallite Diameter

It is known that a crystallite diameter may be evaluated based on a line width (full width at half maximum: FWHM) of the diffraction pattern in an XRD. The Scherrer formula is represented by D=Kλ/B cos θ. Here, D indicates a crystallite size, K indicates the Scherrer constant, λ indicates a wavelength of the X-ray (CuKα=1.5418 A°), B indicates a line width of a sample obtained by subtracting a line width of the apparatus itself from the FWHM, and θ indicates a Bragg angle (half of a diffraction angle 2θ).

In this specification, K=0.63661, which is defined by a volume-weighted average thickness, is used and a line width $B_{si}$=0.19918 which is obtained by an XRD apparatus measuring a silicon standard sample, is used as the line width of the apparatus itself.

Tables 1 and 2 illustrate a composition dependence of a crystallite diameter of a (200) plane and (002) plane which are obtained based on the diffraction pattern by using the Scherrer formula, and a composition dependence of a ratio ($D_{(200)}/D_{(002)}$) of the crystallite diameter $D_{(200)}$ of the (200) plane and the crystallite diameter $D_{(002)}$ of the (002) plane. As illustrated in Tables 1 and 2, in any one of Examples 1 to 25, the crystallite diameter of the (002) plane is smaller than the crystallite diameter of the (200) plane, and is equal to or less than 15 nm. The crystallite diameter of the (200) plane is about 3 times to about 13 times the crystallite diameter of the (002) plane.

Lattice Matching Performance with Base Layer

It is known that the lattice matching performance with the base layer 70a is important for orientation control in the piezoelectric layer 70. Tables 1 and 2 illustrate lattice mismatching rates of a (200) peak of the PZT which is the base layer 70a, and a (002) peak and a (200) peak of the PNN-PZT which is the piezoelectric layer 70. The lattice mismatching rate of the (002) peak corresponds to the lattice mismatching rates of the c-axis of PNN-PZT (the base layer 70) to the PZT (the base layer 70a). The lattice mismatching rate of the (200) peak corresponds to the lattice mismatching rates of the a-axis and b-axis of PNN-PZT (the base layer 70) to the PZT (the base layer 70a). The lattice mismatching rate was obtained by obtaining d values based on 2d sin θ=nλ being a Bragg condition, and obtaining an absolute value of a difference between the d values. The less lattice mismatching rate means the better lattice matching performance.

As illustrated in Tables 1 and 2, the piezoelectric element 300 in each of Examples 1 to 25 has significantly good lattice matching performance, that is, a lattice mismatching rate in a (002) component of the PNN-PZT is in a range of 0.01% to 0.62%. The (200) component has lattice mismatching rate which is in a range of 1.15% to 2.31%. For this reason, the PZT being the base layer 70a functions as a {100} orientation control layer, and thus it is possible to manufacture the PNN-PZT having the (002) component having good lattice matching performance.

DBLI Measurement

Regarding Examples 1 to 25 and Comparative Examples 1 to 6, a relationship of an electric-field-induced strain quantity and a voltage in a unipolar mode was obtained by using a displacement measuring apparatus (DBLI) manufactured by Axact Corporation. Measurement was performed by setting a measurement temperature to the room temperature (25°), setting an electrode pattern to φ=500 μm, setting a waveform to be triangular, and setting a frequency to 1 kHz.

Tables 1 and 2 illustrate results of DBLI displacement and an electric field induced strain constant ($d_{33}*$). As illustrated in Tables 1 and 2, Examples 1 to 25 have the excellent DBLI displacement and electric field induced strain constant ($d_{33}*$). In this manner, the reason of the PNN-PZT oriented to {100} having significantly high voltage characteristics results from rotation of 90° domain. As described below, the PNN-PZT has a relatively high c/a of 1.026 to 1.015, and has an electric field response indicating that a ratio of the (100) component and the (001) component is changed. Such an electric field response is generated by a polarization axis of the (100) component being orthogonal to an electric field. When {111} orientation occurs as in Comparative Example 1, the polarization axis is inclined from the electric field and an angle of the (100) component and the (001) component becomes smaller. For this reason, an influence received from the electric field becomes small, and performing of 90° domain rotation is difficult. Consequently, the electric field induced strain constant becomes smaller.

TABLE 1

| | x | y | z | D(200) (nm) | D(002) (nm) | D(200)/D(002) | $\epsilon_\gamma$ | DBLI displacement (nm) | (002) mismatching rate | (200) mismatching rate | $d_{33}$* (pm/V) |
|---|---|---|---|---|---|---|---|---|---|---|---|
| Example 1 | 40 | 10 | 50 | 64.49 | 12.98 | 4.97 | 2394 | 4.14 | 0.20% | 1.61% | 166 |
| Example 2 | 30 | 10 | 60 | 65.49 | 12.74 | 5.14 | 1769 | 4.83 | 0.14% | 1.76% | 193 |
| Example 3 | 20 | 10 | 70 | 55.34 | 11.72 | 4.72 | 1130 | 4.22 | 0.18% | 1.98% | 169 |
| Example 4 | 10 | 10 | 80 | 35.58 | 8.45 | 4.21 | 723 | 3.76 | 0.15% | 2.36% | 151 |
| Example 5 | 30 | 20 | 50 | 108.49 | 8.29 | 13.08 | 1693 | 3.89 | 0.57% | 1.22% | 155 |
| Example 6 | 20 | 20 | 60 | 57.39 | 10.70 | 5.36 | 1106 | 4.65 | 0.20% | 1.53% | 186 |
| Example 7 | 10 | 20 | 70 | 38.76 | 7.79 | 4.98 | 822 | 3.83 | 0.14% | 1.86% | 153 |
| Example 8 | 20 | 30 | 50 | 61.94 | 13.87 | 4.47 | 1694 | 4.27 | 0.68% | 3.11% | 171 |
| Example 9 | 10 | 30 | 60 | 55.12 | 6.55 | 8.42 | 1122 | 3.93 | 0.82% | 1.27% | 157 |
| Example 10 | 10 | 40 | 50 | 47.06 | 14.29 | 3.29 | 1694 | 4.06 | 0.54% | 3.03% | 163 |
| Comparative Example 1 | 50 | 0 | 50 | 50.18 | 14.78 | 3.40 | 1501 | 1.62 | 0.01% | 1.96% | 65 |
| Comparative Example 2 | 40 | 0 | 60 | 42.17 | 13.35 | 3.16 | 1802 | 2.01 | 0.08% | 2.07% | 80 |
| Comparative Example 3 | 30 | 0 | 70 | 48.39 | 12.37 | 3.91 | 1031 | 2.93 | 0.13% | 2.29% | 117 |
| Comparative Example 4 | 20 | 0 | 80 | 68.40 | 11.36 | 6.02 | 952 | 1.66 | 0.21% | 2.54% | 66 |
| Comparative Example 5 | 10 | 0 | 90 | 48.07 | 9.42 | 5.10 | 740 | 1.30 | 0.10% | 2.86% | 52 |
| Comparative Example 6 | Pb(Zr$_{52}$, Ti$_{48}$)O$_3$ | — | — | — | — | — | 2045 | 3.75 | — | — | 149 |

TABLE 2

| | x | y | z | D(200) (nm) | D(002) (nm) | D(200)/D(002) | $\epsilon_\gamma$ | DBLI displacement (nm) | (002) mismatching rate | (200) mismatching rate | $d_{33}$* (pm/V) |
|---|---|---|---|---|---|---|---|---|---|---|---|
| Example 11 | 38 | 6 | 56 | 59.41 | 9.39 | 6.33 | 1513 | 4.41 | 0.22% | 1.75% | 176 |
| Example 12 | 34 | 6 | 60 | 47.20 | 9.39 | 5.03 | 1364 | 5.75 | 0.29% | 1.80% | 230 |
| Example 13 | 30 | 6 | 64 | 48.50 | 9.41 | 5.15 | 1129 | 6.18 | 0.29% | 1.88% | 247 |
| Example 14 | 26 | 6 | 68 | 47.60 | 8.97 | 5.30 | 904 | 5.58 | 0.32% | 2.00% | 223 |
| Example 15 | 22 | 6 | 72 | 46.45 | 10.35 | 4.49 | 524 | 5.58 | 0.24% | 2.13% | 223 |
| Example 16 | 34 | 10 | 56 | 60.25 | 9.63 | 6.26 | 1774 | 5.13 | 0.30% | 1.61% | 205 |
| Example 17 | 30 | 10 | 60 | 56.02 | 10.49 | 5.34 | 1151 | 6.16 | 0.25% | 1.71% | 247 |
| Example 18 | 26 | 10 | 64 | 47.98 | 9.69 | 4.95 | 1071 | 6.36 | 0.28% | 1.77% | 255 |
| Example 19 | 22 | 10 | 68 | 44.35 | 10.16 | 4.37 | 888 | 5.58 | 0.26% | 1.92% | 223 |
| Example 20 | 30 | 14 | 56 | 52.64 | 10.08 | 5.22 | 1355 | 4.10 | 0.31% | 1.46% | 164 |
| Example 21 | 26 | 14 | 60 | 44.97 | 10.53 | 4.27 | 1070 | 5.95 | 0.28% | 1.56% | 238 |
| Example 22 | 22 | 14 | 64 | 45.57 | 9.50 | 4.80 | 762 | 6.05 | 0.34% | 1.69% | 242 |
| Example 23 | 26 | 18 | 56 | 56.15 | 10.96 | 5.12 | 1244 | 4.26 | 0.31% | 1.37% | 171 |
| Example 24 | 22 | 18 | 60 | 43.88 | 9.21 | 4.76 | 1257 | 5.29 | 0.35% | 1.45% | 212 |
| Example 25 | 22 | 22 | 56 | 74.66 | 8.05 | 9.28 | 1478 | 4.32 | 0.75% | 1.18% | 173 |
| Comparative Example 6 | Pb(Zr$_{52}$, Ti$_{48}$)O$_3$ | — | — | — | — | — | 2045 | 3.75 | — | — | 149 |

FIG. 12 illustrates a relationship of composition ratios (composition ratio of xPb(Ni$_{1/3}$, Nb$_{2/3}$)O$_3$, yPbZrO$_3$, and zPbTiO$_3$) in Examples 1 to 10 illustrated in Table 1 and Examples 11 to 25 illustrated in Table 2 (in FIG. 12, an example number corresponding to a plot is abbreviated to "Ex." However, such a range is only an example of a specific embodiment of the invention, and the invention is not limited to Examples 1 to 25.

Ratio (c/a) of C-Axis and A-Axis

Regarding Examples 1 to 25, the ratio (c/a) of the c-axis and the a-axis of the piezoelectric layer 70 was calculated based on the following relational expression (3) between the Bragg angle and the Miller index.

$$\sin^2\theta = \lambda^2/4\{(h^2+k^2)/a^2 + l^2/c^2\} \quad (3)$$

The value of θ in expression (3) can be obtained by identifying the value of 2θ on the (001) peak which corresponds to the c-axis component of PNN-PZT, and identifying the value of 2θ on the (100) peak which corresponds to the a-axis component of PNN-PZT. In expression (3), h=k=0 and l=1 regarding c-axis component, h=1 and k=l=0 regard-ing a-axis component, and λ indicates a wavelength of the X-ray (CuKα=1.5418 A°). The ratio "c/a" can be obtained by assigning these values to expression (3) and calculating the value "c" where (hkl)=(001) and the value "a" where (hkl)=(100). The ratios "c/a" obtained in this manner are shown in Table 3.

TABLE 3

| | 2θ (001) | 2θ (100) | c/a |
|---|---|---|---|
| Example 1 | 22.25986 | 22.43618 | 1.015 |
| Example 2 | 22.19648 | 22.42224 | 1.019 |
| Example 3 | 22.15517 | 22.43186 | 1.024 |
| Example 4 | 22.1081 | 22.40538 | 1.026 |
| Example 5 | 22.04445 | 22.25983 | 1.019 |
| Example 6 | 21.99546 | 22.2449 | 1.022 |
| Example 7 | 22.13591 | 22.36328 | 1.020 |
| Example 8 | 22.23904 | 22.42301 | 1.016 |
| Example 9 | 22.23964 | 22.4391 | 1.017 |
| Example 10 | 21.99261 | 22.20673 | 1.019 |
| Example 11 | 22.03189 | 22.21291 | 1.016 |
| Example 12 | 22.26161 | 22.4405 | 1.015 |

TABLE 3-continued

|  | 2θ (001) | 2θ (100) | c/a |
|---|---|---|---|
| Example 13 | 22.22793 | 22.44828 | 1.019 |
| Example 14 | 22.33045 | 22.54759 | 1.019 |
| Example 15 | 22.13017 | 22.4075 | 1.024 |
| Example 16 | 22.0511 | 22.30854 | 1.022 |
| Example 17 | 22.14174 | 22.41906 | 1.024 |
| Example 18 | 22.16395 | 22.44401 | 1.024 |
| Example 19 | 22.15788 | 22.45029 | 1.025 |
| Example 20 | 22.02221 | 22.30044 | 1.024 |
| Example 21 | 22.14958 | 22.43221 | 1.024 |
| Example 22 | 22.04625 | 22.3095 | 1.023 |
| Example 23 | 22.12825 | 22.3983 | 1.023 |
| Example 24 | 22.19391 | 22.49986 | 1.026 |
| Example 25 | 22.15513 | 22.45135 | 1.026 |

The PNN-PZT has a relatively high c/a of 1.026 to 1.015 as shown in Table 3.

As described above, the piezoelectric layer 70 has the tetragonal crystal structure and the crystal is oriented to {100} against the substrate. The areas, each area including (100) plane and (001) plane orthogonal to the stacking direction of the piezoelectric element 300, are mixed in the crystal lattice. According to the piezoelectric elements 300 in Examples 1 to 25, in which the composite oxide of the piezoelectric layer 70 is represented by the general expression (2), the piezoelectric elements 300 can have improved piezoelectric constant and has excellent piezoelectric characteristics. Particularly, according to the piezoelectric elements 300 in Examples 11 to 25, in the piezoelectric element 300, inclination which allows the DBLI displacement or the electric field induced strain constant ($d_{33}$*) to be further improved is obtained.

Other Embodiments

Hitherto, one embodiment of the piezoelectric element according to the invention, the liquid ejecting head, and the liquid ejecting apparatus in which the piezoelectric element is mounted is described. However, the basic configuration of the invention is not limited to the above description. For example, in Embodiment 1, a silicon single crystal substrate is described as the flow passage formation substrate 10, but it is not particularly limited thereto. For example, the flow passage formation substrate 10 may be formed of a material of an SOI substrate, glass, or the like.

An ultrasonic measuring apparatus including the piezoelectric element according to the invention and a control section may be made in addition to Embodiment 1. The control section measures a detection target by using a signal obtained based on at least one of an ultrasonic wave transmitted by the piezoelectric element, and an ultrasonic wave received by the piezoelectric element.

Such an ultrasonic measuring apparatus may obtain information regarding a position, a shape, a speed, and the like of a measuring target object, based on a period of time from a point of time when an ultrasonic wave is transmitted until a point of time when the transmitted ultrasonic wave is reflected by the measuring target object and thus an echo signal returning by reflection is received. The piezoelectric element may be used as an element form generating an ultrasonic wave, or an element for detecting an echo signal. If the piezoelectric element according to the invention, which has an improved piezoelectric constant is used as such an ultrasonic wave generation element or an echo signal detection element, it is possible to provide an ultrasonic measuring apparatus having high ultrasonic wave generation efficiency or high echo signal detection efficiency.

In addition, in Embodiment 1, description is made by using the ink jet recording head as an example of the liquid ejecting head. However, the invention can be used for liquid ejecting heads in general and may be easily applied to a liquid ejecting head which ejects a liquid except for an ink. Examples of other liquid ejecting heads include various recording heads which are used in an image recording apparatus such as a printer, a color material ejecting head which is used in manufacturing of a color filter in a liquid crystal display or the like, an electrode material ejecting head which is used in forming of an electrode in an organic EL display, an electric field discharging display (FED), or the like, a living body organic matter ejecting head which is used in manufacturing of a biochip, and the like.

The piezoelectric element according to the invention is not limited to a piezoelectric element used in the liquid ejecting head, and may be used in other devices. Examples of other devices include an ultrasonic wave device such as an ultrasonic wave transmitter, an ultrasonic wave motor, a thermal-electric converter, a pressure-electric converter, a ferroelectric transistor, a piezoelectric transformer, a filter and the like. Examples of the filter include a blocking filter of a harmful light beam such as an infrared ray, an optical filter using a photonic crystal effect occurring by forming a quantum dot, an optical thin film filter using optical interference, and the like. The invention may be applied to a piezoelectric element which is used as a sensor, and a piezoelectric element which is used as a ferroelectric memory. Examples of the sensor using the piezoelectric element include an infrared sensor, an ultrasonic wave sensor, a thermal sensitive sensor, a pressure sensor, a pyroelectric sensor, a gyro sensor (angular velocity sensor), and the like.

The piezoelectric element 300 according to the invention may be appropriately used in a ferroelectric element. Examples of the ferroelectric element which can be appropriately used include a ferroelectric transistor (FeFET), a ferroelectric computation circuit (FeLogic), and a ferroelectric capacitor, and the like. Since the piezoelectric element 300 according to this embodiment has good pyroelectric characteristics, the piezoelectric element 300 may be appropriately used in a pyroelectric element. Examples of the pyroelectric element which can be appropriately used include a temperature detector, a living body detector, an infrared ray detector, a terahertz detector, a thermal-electric converter, and the like.

Hitherto, the invention is described, but particularly according to Embodiment 1, a piezoelectric element having high electro-mechanical converting capacity, high sensitive stress detecting capacity, high sensitive vibration detecting capacity, and vibration-power generation capacity may be configured by using displacement due to 90° domain rotation. A high density liquid ejecting head, a liquid ejecting head that allows control of various droplet sizes, and a liquid ejecting head that allows correspondence to high viscosity liquid may be configured by using displacement occurring due to 90° domain rotation. A high output ultrasonic wave transmitter, a high dynamic ultrasonic wave transmitter, an ultrasonic wave transmitter which is compact and highly integrated, an ultrasonic wave transmitter which generates a small amount of heat, and an ultrasonic wave transmitter having low consumed power may be configured by using displacement occurring due to 90° domain rotation. A high sensitive ultrasonic wave detector, an ultrasonic wave detector having a high S/N ratio, an ultrasonic wave detector that allows detection of a deep portion, and an ultrasonic wave detector having low consumed power may be configured by using displacement occurring due to 90° domain rotation.

The foregoing description has been given by way of example only and it will be appreciated by a person skilled in the art that modifications can be made without departing from the scope of the present invention.

The entire disclosure of Japanese Patent Application No. 2014-136247, filed Jul. 1, 2014 is expressly incorporated by reference herein.

What is claimed is:

1. A piezoelectric element in which a first electrode, a piezoelectric layer, and a second electrode are sequentially stacked on a substrate, the piezoelectric layer being formed of composite oxide having a perovskite structure which contains at least Pb, Nb, and Ti, wherein the piezoelectric layer has a tetragonal crystal structure, the crystal is oriented to {100} against the substrate, and regions are mixed in a crystal lattice, each region including a (100) plane and a (001) plane which are orthogonal to a stacking direction, wherein the crystal has a crystallite diameter $D_{(002)}$ of equal to or less than 15 nm, and the composite oxide of the piezoelectric layer is represented by the general expression $x\text{Pb}_1(\text{Ni}_{1/3},\text{Nb}_{2/3})\text{O}_3\text{-}y\text{PbZrO}_3\text{-}z\text{Pb}_1\text{TiO}_3$ where $10 \leq x \leq 40$, $0 < y \leq 40$, and $50 \leq z \leq 90$.

2. The piezoelectric element according to claim 1, wherein relationships of $22 \leq x \leq 38$, $0 < y \leq 22$, and $56 \leq z \leq 72$ are satisfied in the general expression.

3. The piezoelectric element according to claim 1, wherein a ratio ($D_{(200)}/D_{(002)}$) of a crystallite diameter $D_{(200)}$ and a crystallite diameter $D_{(002)}$ in the crystal is greater than 3.

4. The piezoelectric element according to claim 1, wherein the piezoelectric layer includes a base layer that is provided on the first electrode side and that has lattice mismatching rate of less than 1% with a c-axis of the composite oxide of the piezoelectric layer and lattice mismatching rate of equal to or greater than 1% with an a-axis and a b-axis of the composite oxide.

5. The piezoelectric element according to claim 4, wherein the piezoelectric layer has a relative dielectric constant less than a relative dielectric constant of the base layer formed of the composite oxide.

6. The piezoelectric element according to claim 4, wherein the composite oxide in the piezoelectric layer has a ratio (c/a) of the c-axis and the a-axis which is in a range of 1.026 to 1.015.

7. The piezoelectric element according to claim 4, wherein the base layer is formed of PZT.

8. An actuator device comprising:

the piezoelectric element according to claim 1.

9. A liquid ejecting head comprising:

the actuator device according to claim 8.

10. A liquid ejecting apparatus comprising:

the liquid ejecting head according to claim 9.

11. An ultrasonic measuring apparatus comprising:

the piezoelectric element according to claim 1; and a control section that measures a detection target by using a signal obtained based on at least one of an ultrasonic wave transmitted by the piezoelectric element and an ultrasonic wave received by the piezoelectric element.

* * * * *